United States Patent

Aviram

[11] 4,297,434
[45] Oct. 27, 1981

[54] PHOTODEFORMABLE ARTICLE HAVING PHOTOIONIZABLE GROUPS ON A POLYMER BACKBONE

[75] Inventor: Ari Aviram, Yorktown Heights, N.Y.

[73] Assignee: International Business Machines Corporation, Armonk, N.Y.

[21] Appl. No.: 159,098

[22] Filed: Jun. 13, 1980

Related U.S. Application Data

[62] Division of Ser. No. 50,931, Jun. 21, 1979, Pat. No. 4,247,622.

[51] Int. Cl.³ .................................................. G03C 1/68
[52] U.S. Cl. ................................. 430/270; 204/159.14; 204/159.18; 430/271; 430/290; 430/272; 430/322
[58] Field of Search ............... 430/270, 271, 290, 329, 430/272; 204/159.14, 159.18

[56] References Cited
U.S. PATENT DOCUMENTS 3,578,458  5/1971  Taylor ................................. 430/322
4,124,389  11/1978  Hoornstra et al. .............. 204/159.14

Primary Examiner—Jack P. Brammer
Attorney, Agent, or Firm—Hansel L. McGee

[57] ABSTRACT

The invention is directed to polymeric materials which undergo deformation upon exposure to actinic radiation. These polymeric materials contain at least one photoionizable group attached to a polymer backbone structure. Typically, photoionizable groups can include N,N-dimethyl-p-phenylenediamine, tetrathiafulvalene, tetraselenafulvalene, ferrocene, tetrathiatetracene and leuco dyes such as leuco methyl violet. Polymer backbone structures which can be used can be chosen from polyacrylics, polyglutamate, polyvinyl amine, polyvinyl alcohol, polystyrene and the like.

Films of these materials when exposed to actinic radiation display deformations with dilations of about 35% in each dimension. They are useful for forming relief images for printing, three dimensional photography, photocopy, holographic information storage, information storage and actinometry.

2 Claims, 1 Drawing Figure

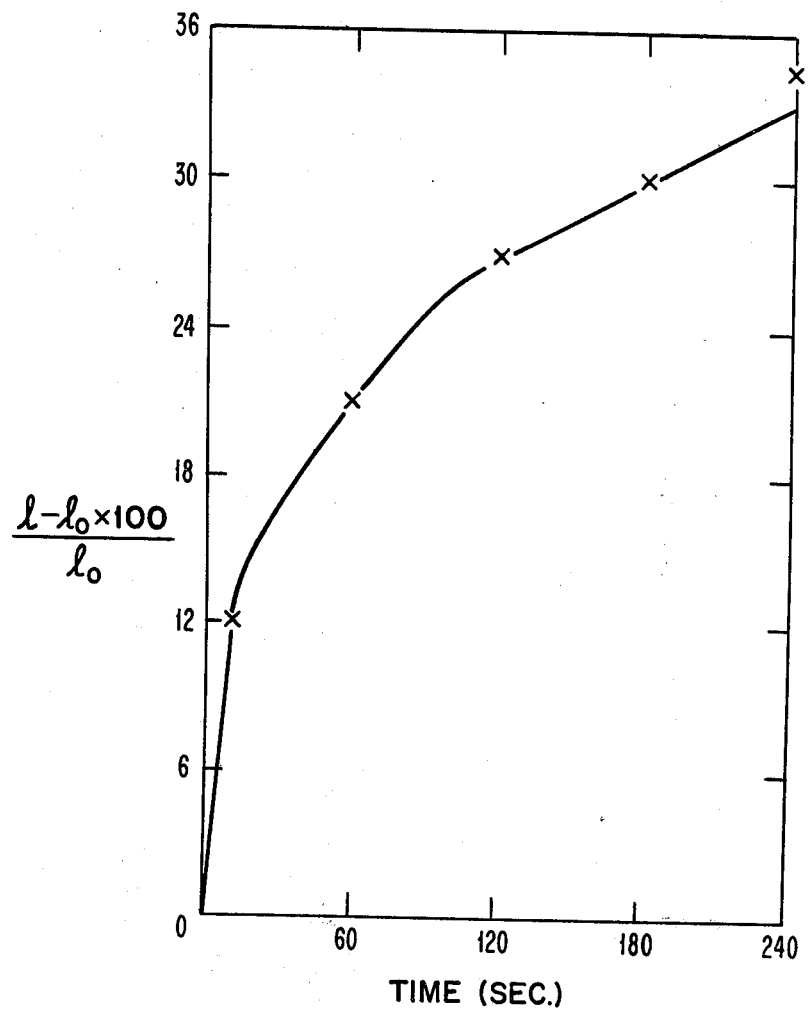

PHOTODEFORMABLE ARTICLE HAVING PHOTOIONIZABLE GROUPS ON A POLYMER BACKBONE

This is a division, of application Ser. No. 050,931 filed June 21, 1979 now U.S. Pat. No. 4,247,622.

BACKGROUND OF THE INVENTION

1. Field of the Invention

This invention relates to photodeformable materials which when exposed to actinic radiation display deformations with dilations of about 35% in each dimension or, stated another way, a volume change of about 146% for any unit volume. More specifically, the invention is directed to a composition of matter comprising a polymeric backbone structure having a photoionizable compound attached thereto, and to a method of preparing relief images using said composition.

2. Prior Art

Mechano-chemical behavior of polymeric materials are well known. For example, the dilation and contraction of synthetic fibers due to changes in the state of ionization of polyelectrolytic gels have been observed as early as 1950. See for example the publication to W. Kuhn et al entitled "Reversible Dilation and Contraction by Changing the State of Ionization of High Polymer Acid Networks," Nature 165, 514 (1950). It is shown there that the expansion of polyacrylic acid gels were induced by suspension in alkali solutions while restoration of the original size took place when the solution was titrated with acid. Similar results were noticed by a Katchalsky et al in the publication entitled "Polyvinylphosphate Contractile Systems," Nature 166, 267 (1950), where it is shown that threads of polyvinylphosphate on the addition of strong alkali elongated to about three times their original lengths.

More recently, mechanical deformations in polymeric materials have been observed when they have been exposed to actinic radiation. More specifically, these materials have been shown to undergo a mechanical-photochemical behavioral change. For example, in the publication to P. H. Vanderwijzer et al entitled "Photochromic Polymers" J. Polymer Sci. 22, 231 (1968) and the publication to G. Smets entitled "Photochromic Behaviour of Polymeric Systems and Related Phenomena", Journal Appl. Chem. 30, 1 (1972), a photochromic spiropyran polymer displayed a 3% light induced deformation. Deformations as much as 1.2% has been shown by G. Van Der Veen et al in the publication entitled "Photoregulation of Polymer Conformation. A Model Study of Biology," Polyelectrolytes E. Selegny Edidor, D. Reidel Publishing Company, P. 483 (1974), taught that poly(methyacrylic acid) gels buffered with solutions of trans-p-(trimethylammonium) azobenzene iodide, a cis-trans photoisomerizable dye showed a 1.2% elongation when irradiated for ten minutes with a focused intense source of light. While the prior art has given examples of mechancophotochemical changes in polymeric materials, these changes have been too slight to be meaningful for any practical application. What has been discovered here is that the composition hereinafter disclosed will undergo deformations with dilations of as high as about 35% in each dimension or stated another way will undergo a volume change of about 146% for any unit volume. These materials can be used to form relief images thus may find applications in printing. Similarly, since relief images of three dimensions can be obtained there may be used for information storage as well as holographic information storage.

SUMMARY OF THE INVENTION

The present invention provides a mechano-photochemical composition which undergoes a photoioization reaction that causes a deformation of about 35%. The composition is comprised of a photoionizable moiety and a polymeric backbone, said photoionizable moiety can be selected from the group consisting of N,N-dimethyl-p-phenylenediamine or other donor groups such as tetrathiafulvalene, tetraselenafulvalene, ferrocene, tetrathiatetracene and leuco dyes such as leuco methyl violet, and said polymer backbone may be selected from a group consisting of polyacrylics, polyglutamate, polyvinyl amine, polyvinyl alcohol, polystyrene and the like.

In another embodiment of the invention there is provided a method for forming relief images. Wherein the composition of the invention is deposited on a substrate and subsequently exposed to actinic radiation in a predetermined pattern.

BRIEF DESCRIPTION OF THE DRAWING

The figures exhibits a plot of the observed deformation vs. exposure time of a composition of the present invention.

DESCRIPTION OF THE PREFERRED EMBODIMENT

The photodeformable materials of the present invention are prepared from a photoionizable composition selected from the group consisting of N,N, dimethyl-p-phenylenediamine, tetrathiafulvalene, tetraselenafulvalene, ferrocene, tetrathiatetracene and leuco dyes such as leuco methyl violet, and a polymeric backbone selected from the group consisting of polyacrylics, polyglutamate, polyvinyl amine, polyvinyl alcohol, and polystyrene.

The donor groups are photoionized to charged species in the presence of halogenated hydrocarbons or acceptor groups. A preferred halogenated hydrocarbon or acceptor can be selected from the group consisting of $CBr_4$, $CCl_4$, $C_2Cl_4Br_2$ and $CH_2Br_2$. For example, see the publication to Ari Aviram, entitled "Mechanophotochemistry," Macromolecules, Vol. 11, p. 1275, Dec. 1978.

A typical synthetic path to one of the preferred compositions of the present invention, e.g., poly-4-(N,N,-dimethylamino)-N-γ-D glutamanilide, is as follows:

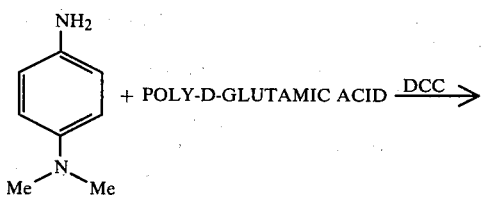

-continued

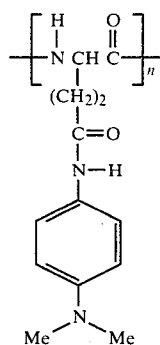

DDC = Dicyclohexylcarbodiimide

The photoionizable composition can be similarly reacted with other polymer backbone compositions, for example, polyacrylics, polyglutamate, polyvinyl amine, polyvinyl alcohol, polystyrene and the like, to provide other embodiments of the invention.

The reaction can be carried out in the following solvents, N,N-dimethylformamide, N,N-dimethylacetamide, Hexamethylphosphoric triamide, tetramethylene sulfone, tetramethylene sulfoxide, dimethyl sulfoxide and the like.

The resultant polymer is then crosslinked to from about 1.0% to about 5.0% to form a gel. Suitable crosslinking agents can be selected from a preferred crosslinking agent which is 2,6-bis-(bromomethyl)naphthalene. Other crosslinking agents may be chosen from among $\alpha$, $\omega$-dihalogenated compounds; $\alpha$, $\omega$-dialcohols; $\alpha$, $\omega$-diacids. Typically $\alpha$, $\omega$ compounds which can be used in the present invention include those having the general formulae,

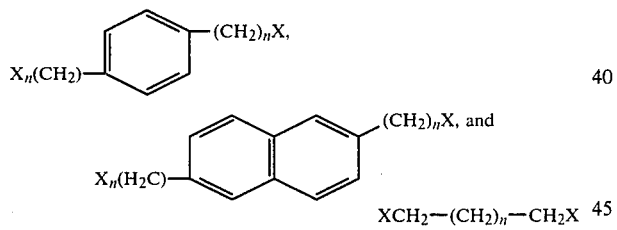

$$XCH_2-(CH_2)_n-CH_2X$$

where X is selected from a halogen, an alcoholic, an acid and an amine group and n is from 1 to 50. Preferably the resultant polymer is crosslinked at about 1.5%.

Films of the prepared polymer can be case onto a substrate from a suitable solvent to which a preferred crosslinking agent has been added. The casted film is permitted to dry slowly so that crosslinking can occur. Films having thickness of from about 10 $\mu$m to about 1 mm. are prepared. Carbon tetrabromide or other halogenated acceptors mentioned above are incorporated into the films.

The prepared films can then be irradiated by actinic radiation. Sources of actinic radiation can be high pressure mercury lamps with filters such as "Calobars" that transmits at 3650 Å or Xenon lamps, $N_2$ lasers or Cd lasers. In preferred embodiments a source of "black light" rated at 1680$\mu$ watts/cm$^2$ and having a wavelength of 3650 Å is used. Prior to irradiation the film is swollen with a suitable solvent, such as N,N-dimethylformamide, N,N-dimethylacetamide, Hexamethylphosphoric triamide, tetramethylene sulfone, tetramethylene sulfoxide, dimethyl sulfoxide, into which is incorporated a halogenated acceptor, e.g., $CBr_4$, $CCl_4$, $C_2Cl_4Br_2$ or $CH_2Br_2$.

The foregoing and other objects, features and advantages of the invention will be apparent from the following more particular description of a preferred embodiment of the invention.

EXAMPLES

The following examples are given solely for purposes of illustration and are not to be considered limitations on the invention's many variations of which are possible without departing from the spirit or scope thereof.

EXAMPLE 1

Poly-p-(N,N-dimethylamino)-N-$\gamma$-D-glutamanilide.

About 0.5 gm. of Poly-D-glutamic acid, having a Molecular Weight of 12,400, is dissolved in 50 ml dry N,N-dimethylformamide to which 2 gm. of freshly distilled N,N-dimethyl-p-phenylenediamine is added. The solution is cooled to 0° C. and 1 gm. DCC is added with stirring. Stirring is continued at 0° C. for one hour and at room temperature for an additional 24 hours. One ml of dry methanol is added and stirring is continued for an additional hour. The precipitate is filtered off and the filtrate is evaporated to dryness at 0.01 mm. 35° C. (bath temperature). The residue is dissolved in tetrahydrofuran (THF) and filtered in a dry box under nitrogen. Diethyl ether is added to the solution and the precipitate is filtered and collected under nitrogen. The collected solid is further purified by precipitation from THF with diethyl ether. Anal. calculated: C-62.90, H-6.85, N-16.93—found C-62.69, H-7.64, N-14.54.

Films of Poly-p-(N,N-dimethylamino)-N-$\gamma$-D-glutamanilide are prepared by dissolving 120 mgm. of the compound in 400 mgm. of THF. 2,6-Bis-(bromomethyl) naphthalene, 2.35 mgm. (to provide for 1.5 M% crosslinking) in 100 mgm. THF is added and a film is case on a glass slide. To prevent fast evaporation the film is kept in a chamber saturated with THF vapors. It took about a day to evaporate the solvent. The dry film thickness is 11.5 mil. It took about 24 hours for the crosslinking reaction to take place.

IRRADIATION AND MEASUREMENTS

The so prepared film having an approximate area of 4 mm$^2$ is swollen in N,N-dimethyl formamide. The excess liquid is replaced in the dark with a 5% solution of carbontetrabromide in N,N dimethylformamide, and photographed under a microscope, following a five minute waiting period. The film is irradiated at a distance of 1" with a source of "black light" rated at 1680$\mu$ watts/cm$^2$ at 3650 A, 18 inches away. During the irradiation the film is freely suspended in the liquid to prevent stress and strain. At the end of the irradiation period (as specified) the films were photographed again and the dilations measured from the photographs.

Additionally, films were exposed to varying exposure times and a plot of observed deformations as indicated in the figure was obtained.

EXAMPLE 2

Poly-p-(N,N-dimethylamino)-N-$\gamma$-D-acrylanilide

About 10 gms. of polyacrylic acid, having a Molecular Weight of about 250,000, is dissolved in 200 ml dry N,N-dimethylformamide to which is added 20 gms freshly distilled N,N-dimethyl-p-phenylenediamine.

The solution is cooled under nitrogen to 0° C. and 30 gms. DCC are added.

The solution is stirred for about two hours at 0° C. and for an additional seventy-two hours at room temperature. A precipitate forms after ten minutes that increases in quantity steadily and the solution becomes very viscous. One liter dry solvent is added to permit filtration which could not be affected and therefore the solid was removed by a centrifuge. The liquid is then treated as in Example 1 to yield 8 gms of pure product. Anal. calculated C-69.47, H7.36, N14.74-found C-67.37, H-8.04, N-10.36.

Films prepared of this material and crosslinked to 1.5% by 2,6-bis(bromomethyl)naphthalene exhibited a maximum of 14% dilation in each dimension after four minutes irradiation with a 3650 Å, 1680μ watts/cm$^2$ light source.

EXAMPLE 3

For the purpose of obtaining relief images which strongly adhere to substrates, films are prepared as follows:

About 10 g of 3-Chloropropyltriethoxysilane is dissolved in 50 ml of xylene and refluxed under nitrogen. A wafer of silicon 2.5 in. in diameter was placed in the vapor area. Reflux was continued for 5 hours. The wafer is then rinsed with dry xylene. A solution containing 0.6 g of the polymer prepared in Example 1, 7.83 mg of 2,6-bis(bromomethyl)naphthalene (predissolved in 0.3 g of cyclohexanone), 0.6 g of carbon tetrabromide and 3 g of cyclohexanone is spin coated onto the silicon wafer in the dark. The spin coating is repeated several times to build a film of about 5 μm. The film is left to react in the dark for 72 hours. The films are then irradiated through masks, with a 1680 μW/cm$^2$ light source and immersed into DMF for 5 minutes. Relief images of the patterns exposed are thus obtained.

EXAMPLE 4

Relief images were prepared as in Example 3 except the polymeric composition prepared in Example 2 was substituted for the polymeric composition used therein.

Although the invention has been described with respect to various preferred embodiments thereof, it should be recognized that it is not limited thereto but rather various modifications will occur to and be made by those skilled in the art upon a reading of the present disclosure and such changes are within the spirit of the invention and the scope of the claims.

Having thus described my invention, what I claim as new, and desire to secure by Letters Patent is:

1. A photodeformable article comprising
   (a) a substrate, and
   (b) a film disposed on said substrate, said film being composed of a polymer backbone having at least one photoionizable group attached thereto, a halogenated hydrocarbon and a crosslinking agent, wherein said polymeric backbone is selected from the group consisting of polyacrylics, polyglutamate, polyvinyl amines, polyvinyl alcohols and polystyrenes, and wherein said photoionizable group is selected from the group consisting of N,N-dimethyl-p-phenylenediamine, tetrathiafulvalene, tetraselenafulvalenes, ferrocene, tetrathiatetracene and leuco dyes.

2. A photodeformable article according to claim 1 wherein said crosslinking agent is selected from the group consisting of α, ω-dihalogenated compounds, α, ω-dialcohols, α, ω-diacids and 2,6-bis-(bromomethyl) naphthalene.

* * * * *